Figure 1:
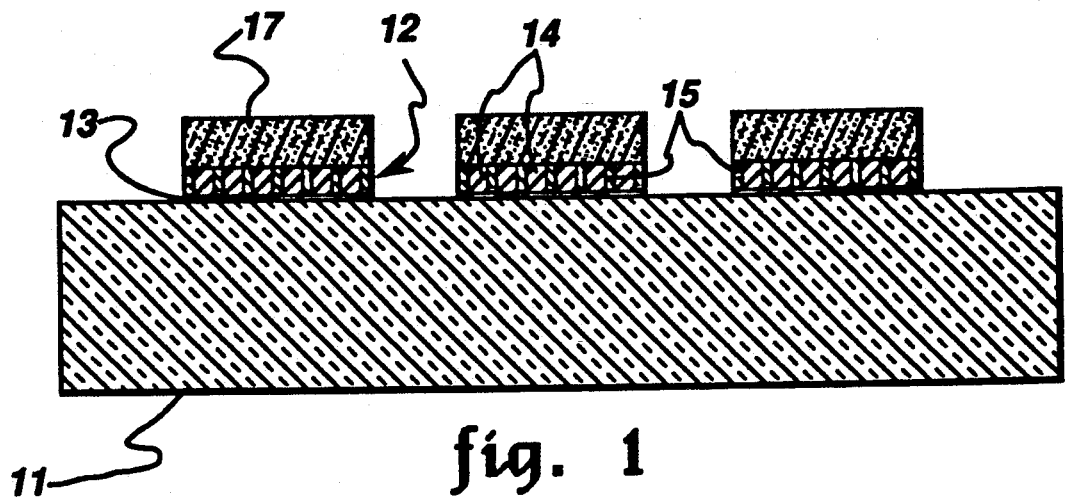

United States Patent [19]

Iacovangelo et al.

[11] Patent Number: 5,324,987
[45] Date of Patent: Jun. 28, 1994

[54] ELECTRONIC APPARATUS WITH IMPROVED THERMAL EXPANSION MATCH

[75] Inventors: Charles D. Iacovangelo, Schenectady; Raymond A. Fillion, Niskayuna; James F. Burgess, Schenectady, all of N.Y.

[73] Assignee: General Electric Company, Schenectady, N.Y.

[21] Appl. No.: 45,753

[22] Filed: Apr. 14, 1993

[51] Int. Cl.$^5$ .................... H01L 23/02; H01L 39/02
[52] U.S. Cl. .................................. 257/701; 257/705; 257/707; 257/720
[58] Field of Search ............... 257/701, 702, 705, 706, 257/707, 717, 720

[56] References Cited

U.S. PATENT DOCUMENTS

| | | | |
|---|---|---|---|
| 3,675,089 | 7/1972 | Hantusch et al. | 257/705 |
| 4,256,792 | 3/1981 | Koepke et al. | 257/705 |
| 4,460,916 | 7/1984 | Hashimoto et al. | 257/701 |
| 5,113,315 | 5/1992 | Capp et al. | 257/706 |

Primary Examiner—Mark V. Prenty
Attorney, Agent, or Firm—William H. Pittman

[57] ABSTRACT

Differences in thermal expansion properties between integrated circuit chips, especially of gallium arsenide, and the dielectric substrates (especially diamond and aluminum nitride) on which said chips are mounted are accommodated by interposing between the substrate and the chip a base having diamond pedestals in combination with a material of higher coefficient of thermal expansion than the substrate, typically a metal such as copper or tungsten. The base may be integral with a diamond substrate or may be a shim interposed between the substrate and the chip.

20 Claims, 1 Drawing Sheet

ELECTRONIC APPARATUS WITH IMPROVED THERMAL EXPANSION MATCH

This invention relates to electronic apparatus, and more particularly to apparatus having one or more integrated circuit chips affixed to an electrically insulating substrate.

Integrated circuit chips are now a major factor in the fabrication of electronic devices. In particular, multichip modules are in common use. Such modules are frequently constructed by affixing a number of chips to a dielectric substrate, typically ceramic, and connecting the chips through conductive paths or vias which may pass through holes in the substrate. A typical chip material is gallium arsenide.

Electronic activity in the chip is accompanied by the generation of varying amounts of heat, which is discharged in large part by transmission to and through the substrate. As the packing density of chips increases, the amount of heat which must be discharged naturally also increases. It is usually desirable to employ a substrate material with a high thermal conductivity. Aluminum nitride is an example of a ceramic substrate material having the desired thermal and electrical properties.

A problem arises, however, by reason of the differing degrees of thermal expansion of gallium arsenide and aluminum nitride. Their coefficients of thermal expansion are 5.85 and 4.5 ppm./° C., respectively. Thus, thermally induced tensile stresses are generated along the adhesion interface between the chip and the substrate.

When the size of the chips, and especially the area of attachment of a chip to the substrate, is relatively small, such thermal stresses are fairly easily discharged and do not present a problem. This is true, for example, in the case of laser diodes whose lateral dimensions are typically on the order of 0.5 mm. However, chips employed for other purposes are increasing in size, typically being as large as 12 mm. in length and/or width with dimensions up to 6 mm. being commonplace. Such chips are also typically very thin, often on the order of 100 microns. When this is the case, the large tensile stresses between the chip and the substrate can result in various detrimental effects such as cracking of the chip or its separation from the substrate.

By reason of its extremely high thermal conductivity and electrical resistivity, diamond is becoming of greater and greater interest as a substrate material for integrated circuits. While single-crystal diamond as exemplified by natural diamond may be used for this purpose, synthetic polycrystalline diamond is more common because of its substantially lower cost. Such diamond may be prepared, for example, by chemical vapor deposition (CVD). However, the thermal expansion difference between gallium arsenide and diamond is even greater than that between gallium arsenide and aluminum nitride, since the coefficient of thermal expansion of CVD diamond is only on the order of 1.5 ppm/° C.

Attempts have been made to overcome this difference in thermal expansion tendency by employing such materials as soft solders and conductive epoxy resins as adhesives to affix the chip to the substrate. Such materials, however, are themselves not fully resistant to the tensile stresses induced. Moreover, their thermal conductivity is much lower than that of diamond, which to some extent defeats the purpose of having a diamond substrate.

It is highly desirable, therefore, to develop a highly thermally conductive means for attaching integrated circuit chips, especially gallium arsenide chips, to substrates of high thermal conductivity such as aluminum nitride and diamond. It is further desirable for the attaching material to permit grading of the stresses induced by the large differences in thermal expansion between the chips and the substrate. These goals are achieved by the present invention.

The invention is directed to electronic apparatus comprising:

a dielectric substrate, a base mounted on or forming an integral part of said substrate and comprising a plurality of diamond pedestals in combination with areas of other material having a higher coefficient of thermal expansion than said substrate, and at least one integrated circuit chip mounted on said base, said chip comprising a material having a higher coefficient of thermal expansion than said substrate;

said diamond pedestals comprising about 10–80% of the area of said base contacting the surface of said chip.

The drawings (FIGS. 1–3) are schematic illustrations of various embodiments of electronic apparatus according to the invention. Identical or similar elements in the various figures are designated by the same reference numbers.

The integrated circuit chips whose use is contemplated according to the present invention are those comprising materials having high coefficients of thermal expansion (hereinafter sometimes "CTE"). In general, the CTE of the chip is higher than that of the dielectric substrate on which it is mounted. The invention is particularly useful for chips having a CTE greater than about 5.5 ppm./°C. One such material is gallium arsenide, for which the value is 5.7 ppm./°C. Further, the invention has particular utility with chips of a relatively large size, especially having a length, width or both greater than about 3 mm.

Another element of the invention is a dielectric substrate on which at least one and usually a plurality of such chips are mounted. Suitable dielectric materials for said substrate include diamond and ceramics such as aluminum nitride. Such materials generally have a lower CTE than the chips mounted thereon, typically at least about 1 and frequently at least about 4 ppm./°C. lower.

The final essential feature of the invention, the base on which the integrated circuit chip is mounted, comprises a plurality of diamond pedestals in combination with other material. As used herein, the word "pedestal" includes diamond areas separated from each other by grooves of other material, and also connected diamond areas with holes therein filled with said other material.

Said other material may be electrically conductive (e.g., metal, conductive plastic) or non-conductive (e.g., ceramic, non-conductive plastic). It is highly preferred that it have high thermal conductivity, and therefore, metals are generally preferred.

The only CTE requirement for the other material is that it be higher than that of the substrate. However, it is usually preferred that said CTE be between those of the substrate and the chip, or, if it is higher than that of the chip, that said other material be soft and capable of yielding to thermal stresses. Tungsten (CTE about 6 ppm./°C.), copper (CTE about 16 ppm./°C.), molybdenum, chromium and alloys thereof are particularly useful. Especially preferred in many instances are tungsten and copper-tungsten alloys, by reason of their superior CTE match; alloys can be formulated to have any desired CTE, within limits.

An essential parameter of the base is the proportion of the area thereof contacting the surface of said chip which comprises diamond, as opposed to other material. Said proportion is about 10–80%, preferably about 15–50%. At values lower than about 10%, there may be insufficient heat transfer from the chip to the substrate; at values higher than about 80%, there is inadequate compensation for the mismatch in CTE and possible results are the previously mentioned debonding or cracking.

As is true of diamond substrates, the diamond pedestals in the base may be formed by various methods. They may constitute natural diamond or synthetic diamond made by the art-recognized high pressure methods, which may be either single crystal or polycrystalline diamond. More often, however, they are polycrystalline diamond made by the CVD method, by reason of the economic advantages afforded by said method.

Numerous structural embodiments of the invention are possible. In some embodiments, the substrate is a non-diamond material such as aluminum nitride and the base is constructed as a shim separating the substrate from the chip. Such shims may be fabricated in the form of large sheets, capable of being cut into pieces of the desired size to fit any chip.

In one embodiment of this type, shown in FIG. 1, substrate 11 has base elements, one of which is designated 12, mounted thereon. Each such base element includes a continuous side 13 attached to substrate 11. A network of parallel grooves, two of which are designated 14, is produced by machining, drilling or etching a diamond sheet, typically by laser or chemical means, and filled with the higher CTE material which thus separates the pedestals, two of which are designated 15. Chips, one of which is designated 17, are mounted on said pedestals.

In another embodiment, holes are laser drilled in a diamond sheet in a desired pattern. Said holes can then be filled with metal of the desired CTE. By varying the number and size of the holes and the thickness of the CVD diamond sheet, shims having graded CTE and thermal conductivity can be produced.

In still another embodiment, diamond is deposited by CVD into holes in a ceramic sheet of higher CTE, frequently with prior metallization of the surfaces of the holes so as to promote nucleation of diamond. The diamond-filled ceramic may then be employed as such or the ceramic, or at least a portion thereof, may be dissolved away and replaced by metal.

Figure 2:
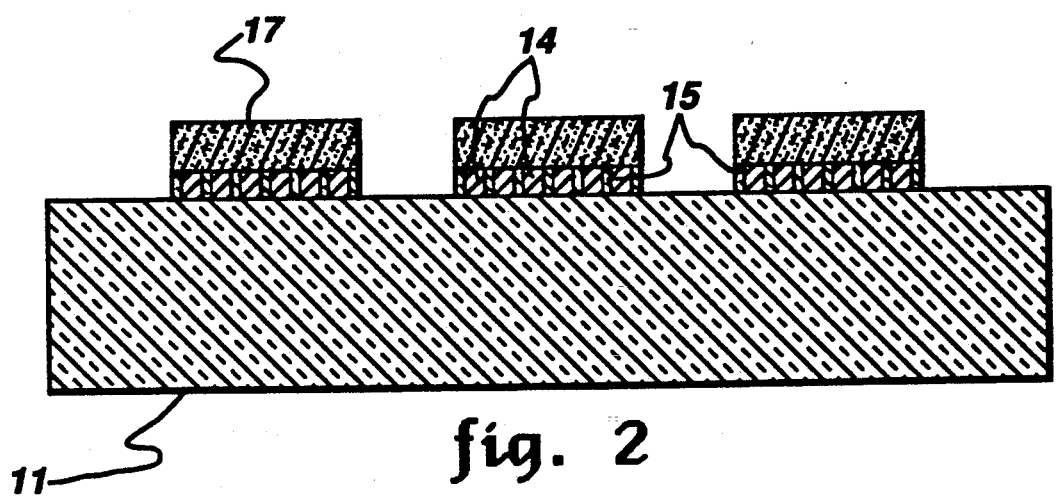

A fourth embodiment, shown in FIG. 2, may be employed with either a diamond or a non-diamond substrate 11. CVD diamond pedestals 15 are deposited into a matrix of metal elements 14, such as a screen, expanded metal mesh or series of oriented metal fibers, to form the base; the metal of elements 14 is resistant to the temperature of diamond formation. Diamond deposition may be directly onto the substrate surface, or a separate diamond-metal sheet may be fabricated and cut into shims of the proper size as described hereinabove. Chips 17 are then mounted on said pedestals.

Figure 3:
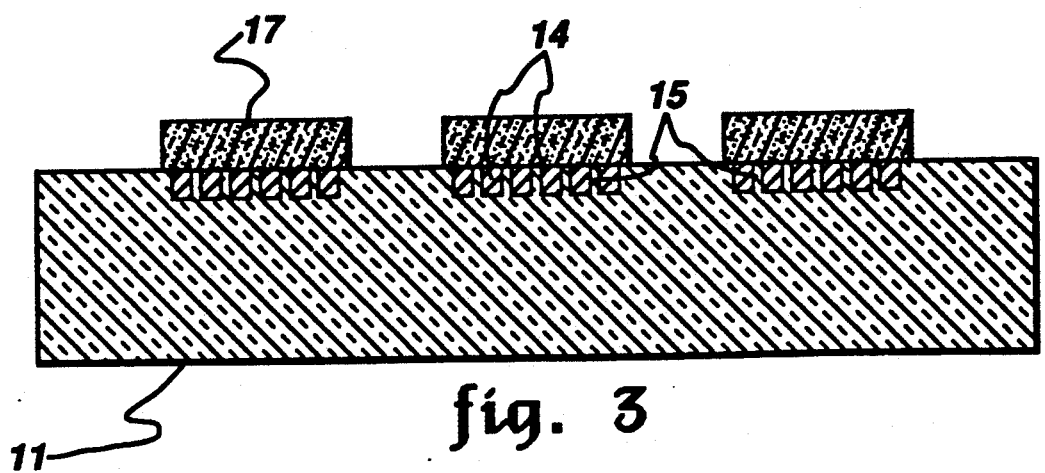

Still another embodiment is shown in FIG. 3. It includes grooves 14 cut in appropriate areas of a diamond substrate 11 by machining or etching as previously described and filled with the material of higher CTE, leaving pedestals 15 between said grooves, and chip 17 mounted on the pedestals. In this embodiment, the diamond of the base is integral with that of the substrate.

It may be advantageous to interpose a thin layer of adhesion-promoting material, usually at least one metal, between the diamond of the base and the other material. Thus, when the other material is a metal, a thin layer of titanium or a titanium-tungsten alloy, typically about 1000 Å thick, may be deposited (e.g., by sputtering) first in appropriate areas and followed by a gold layer of similar thickness.

Adhesion between the chip and the base is generally provided by at least one layer of metal. For example, one or more metal layers, typically of nickel followed by gold, may initially be selectively deposited on metal areas, but not the diamond pedestals, of the base (for example, by electroplating), with each layer being about 1–2 microns thick. A suitable solder is then applied to the deposited metal layer; it may be a soft solder such as lead-tin or a hard solder such as gold-tin, with hard solders generally being preferred. Similar metal layers and solders may be deposited on the substrate to bond a non-integral base thereto, when necessary.

The invention is illustrated by the following examples.

EXAMPLE 1

A 25×25 mm. square of CVD diamond, about 300 microns thick, was laser scribed with essentially V-shaped grooves about 38 microns wide and 64 microns deep in centers 64 microns apart, in a checkerboard pattern. After scribing, the tops of the diamond pedestals separated by the grooves comprised 16% of the previous area of the square.

The walls of the grooves were sputtered with 1000 Å of a 90/10% (by weight) tungsten-titanium alloy and 1000 Å of gold, after which the grooves were filled with copper by electroplating. A layer of nickel followed by a layer of gold, both 1.5 microns thick, were selectively deposited on the copper by electroplating, after which a gallium arsenide integrated circuit chip 8 mm. square and about 500 microns thick was soldered to the gold layer, using an 80/20% gold/tin solder at 310° C. for 20 seconds. No delamination or cracking of the chip was observed upon cooling to room temperature.

EXAMPLE 2

The process of Example 1 was repeated, except that the grooves were filled with tungsten by low pressure chemical vapor deposition, rather than with copper and the gallium arsenide chip was 12 mm. square. The resulting base-chip assembly was subjected to 10 one-hour cycles of heating to 130° C. and cooling to −65° C. It survived those cycles with no delamination or cracking of the chip.

EXAMPLE 3

A number of circular holes, 204 microns in diameter, were laser drilled on 508-micron centers in a grid on a diamond square identical to that of Example 1, producing diamond pedestals with an area of about 72% of the original surface area. The interiors of the holes were sputtered with titanium-tungsten alloy and gold and filled with copper by electroplating, as in Example 1. A 4×4 mm. square integrated circuit chip was fastened to the surface of the diamond square by the procedure of Example 1. It similarly survived cooling from the soldering temperature to room temperature.

In control experiments, gallium arsenide chips 4, 8 and 12 mm. sqaure were attached directly to CVD diamond, without first producing pedestals according to the invention. All chips cracked upon cooling from the soldering temperature to room temperature.

What is claimed is:

1. Electronic apparatus comprising:
   a dielectric substrate,
   a base mounted on or forming an integral part of said substrate and comprising a plurality of diamond pedestals in combination with areas of other material having a higher coefficient of thermal expansion than said substrate, and
   at least one integrated circuit chip mounted on said base, said chip comprising a material having a higher coefficient of thermal expansion than said substrate;
   said diamond pedestals comprising about 10–80% of the area of said base contacting the surface of said chip.

2. Apparatus according to claim 1 wherein the chip comprises gallium arsenide.

3. Apparatus according to claim 1 wherein the substrate comprises diamond or aluminum nitride.

4. Apparatus according to claim 3 wherein the pedestals are separated from each other by grooves of said other material.

5. Apparatus according to claim 3 wherein the pedestals are connected.

6. Apparatus according to claim 3 wherein the other material is metal.

7. Apparatus according to claim 6 wherein the coefficient of thermal expansion of the metal is between those of the substrate and the chip.

8. Apparatus according to claim 7 wherein the metal is tungsten, copper, molybdenum, chromium or an alloy thereof.

9. Apparatus according to claim 6 wherein the coefficient of thermal expansion of the metal is higher than that of the substrate and said metal is capable of yielding to thermal stresses.

10. Apparatus according to claim 9 wherein the metal is copper.

11. Apparatus according to claim 6 wherein said pedestals comprise about 15–50% of the area of said base contacting the surface of said chip.

12. Apparatus according to claim 6 wherein the substrate is diamond.

13. Apparatus according to claim 12 wherein the base is a shim separating the substrate from the chip.

14. Apparatus according to claim 12 wherein the base is integral with the substrate.

15. Apparatus according to claim 6 wherein the substrate is aluminum nitride.

16. Apparatus according to claim 15 wherein adhesion between the substrate and the base is provided by at least one layer of metal.

17. Apparatus according to claim 6 wherein a thin layer of adhesion-promoting material is interposed between the diamond and the other material.

18. Apparatus according to claim 6 wherein adhesion between the chip and the base is provided by at least one layer of metal.

19. Electronic apparatus comprising:
    a diamond substrate;
    a shim mounted on said substrate, said shim having diamond pedestals separated by grooves filled with copper, tungsten or an alloy of copper and tungsten; and
    at least one gallium arsenide integrated circuit chip mounted on said shim;
    said pedestals comprising about 10–80% of the area contacting the surface of said chip.

20. Electronic apparatus comprising:
    a diamond substrate;
    a base integral with said substrate, said base having diamond pedestals separated by grooves filled with copper, tungsten or an alloy of copper and tungsten; and
    at least one gallium arsenide integrated circuit chip mounted on said base;
    said pedestals comprising about 10–80% of the area contacting the surface of said chip.

* * * * *